(12) United States Patent
Jiang et al.

(10) Patent No.: US 7,436,268 B2
(45) Date of Patent: Oct. 14, 2008

(54) SIGNAL TRANSMISSION STRUCTURE, CIRCUIT BOARD AND CONNECTOR ASSEMBLY STRUCTURE

(75) Inventors: Shin-Shing Jiang, Hsin-Tien (TW); Sheng-Yuan Lee, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 198 days.

(21) Appl. No.: 11/217,658

(22) Filed: Aug. 31, 2005

(65) Prior Publication Data

US 2006/0261825 A1    Nov. 23, 2006

(30) Foreign Application Priority Data

Apr. 25, 2005    (TW) .............................. 94113067 A

(51) Int. Cl.
*H03H 7/38* (2006.01)
(52) U.S. Cl. ............................ 333/34; 333/260; 333/33

(58) Field of Classification Search ................ 333/33, 333/34, 260, 246
See application file for complete search history.

(56) References Cited

U.S. PATENT DOCUMENTS

2003/0201123 A1* 10/2003 Kistner ...................... 174/261

* cited by examiner

*Primary Examiner*—Stephen E Jones
(74) *Attorney, Agent, or Firm*—J.C. Patents

(57) ABSTRACT

A signal transmission structure for connecting a coaxial cable connector is provided. The coaxial cable connector has a signal pin. The signal transmission structure includes a reference plane and a conductive layer, and the conductive layer is located on one side of the reference plane. Moreover, the conductive layer includes a signal perforated pad, a first line segment, a second line segment, and a compensation pad. The signal pin is suitable for threading the signal perforated pad. The first line segment is connected to the signal perforated pad, and the compensation pad is connected between the first line segment and the second line segment.

20 Claims, 9 Drawing Sheets

SIGNAL TRANSMISSION STRUCTURE, CIRCUIT BOARD AND CONNECTOR ASSEMBLY STRUCTURE

CROSS-REFERENCE TO RELATED APPLICATION

This application claims the priority benefit of Taiwan application serial no. TW94113067, filed on Apr. 24, 2005. All disclosure of the Taiwan application is incorporated herein by reference.

BACKGROUND OF THE INVENTION

1. Field of Invention

The present invention relates to a signal transmission structure, circuit board, and connector assembly structure. More particularly, it relates to a signal transmission structure, circuit board, and a connector assembly structure with increased impedance continuity on a signal transmission path.

2. Description of Related Art

For large-scale printed circuit board and packaging substrate having electrical connections for signal lines between two elements or terminals, the wire width in the signal line has to be consistent. Thus, during electronic signal transmission, the characteristic impedance of the signal wire can remain the same. Especially during high speed and high frequency signal transmission, a superior impedance matching design between the two terminals is required for reducing reflection due to impedance mismatch, thus lowering the signal transmission insertion loss. And at the same time, the return loss for signal transmission is increased to prevent signal degradation and to improve transmission quality.

FIG. 1A is a top view for a conventional circuit board with an upright Sub-Miniature Type A (SMA) connector, FIG. 1B and FIG. 1C are the cross-sectional views through line A-A' and line B-B' of FIG. 1A respectively; whereas, FIG. 1D and FIG. 1E are the respectively top views of FIG. 1B at the conductive layer and the reference plane. Referring to FIG. 1A through FIG. 1E, a conventional signal transmission structure 100 disposed on a circuit board 20 includes a conductive layer 110 and a reference plane 120. But the conductive layer 110 and the reference plane 120 are parts of components which form the circuit board 20. The conductive layer 110 is disposed on the surface layer of the circuit board 20. In other words, the conductive layer 110 is the uppermost conductive layer of the circuit board 20. The conductive layer 110 includes a signal perforated pad 112, a first line segment 114, a plurality of first alignment perforated pad 116, and a reference plane 118. The first line segment 114 is connected to the signal perforated pad 112. Whereas, the first alignment perforated pad 116 is formed from several portion of the reference plane 118. In addition, the reference plane 118 and the reference plane 120 include a ground plane or a power plane. The reference plane 120 contains a plurality of second alignment perforated pads 122 separately corresponding to the first alignment perforated pads 116.

According to the above descriptions, the upright SMA connector 50 is a coaxial cable connector, and having a signal pin 52 with several alignment pins 54. Wherein, the signal pin 52 is inserted into the corresponding signal through hole 22 of the circuit board 20, passing through the signal perforated pad 112, and coming into physical contact with the signal perforated pad 112, thus allowing for signal transmission through the signal perforated pad 112. Furthermore, the alignment pins 54 are inserted into the corresponding alignment through holes 24 of the circuit board 20, securely disposing the SMA connector 50 on the circuit board 20. In addition, the alignment pins 54 are inserted through the corresponding first alignment perforated pad 116 and the second alignment perforated pad 122 for electrically connecting to the reference plane 120. As a result, a plating through hole (PTH) 24a is formed at the alignment through hole 24 for reinforcing the integrated mechanical strength of the alignment pin 54 and the circuit board 20. In addition, the reference plane 120 includes an insulating pin 124 for preventing short circuit during contact with the signal pin 52.

In the conventional signal transmission structure 100, the characteristic impedance of the signal perforated pad 112 is less than that of the first line segment 114; and the difference of characteristic impedance between the two is dramatic, which leads to increasing of insertion loss during signal transmission, thus affecting signal transmission quality especially during high frequency transmission.

SUMMARY OF THE INVENTION

The objective of the present invention is providing a signal transmission structure for increasing the signal transmission impedance continuity.

Another objective of the present invention is providing a circuit board for improving the impedance continuity in the signal transmission path.

Another objective of the present invention is providing a connector assembly structure for improving the impedance continuity in the signal transmission path for the circuit board.

Based on the above objectives and others, the present invention provides a signal transmission structure suitable for connecting with a coaxial cable connector having a signal pin. The signal transmission structure comprises a first reference plane and a conductive layer. The conductive layer is disposed at a side portion of the first reference plane. In addition, the conductive layer comprises a signal perforated pad, a first line segment, a second line segment, and a compensation pad. The signal pin is expediently inserted through the signal perforated pad, and the first line segment is connected to the signal perforated pad. The compensation pad is connected between the first line segment and the second line segment. In addition, the signal perforated pad has a first characteristic impedance. The second line segment has a second characteristic impedance, and the compensation pad has a third characteristic impedance. The second characteristic impedance is larger than the third characteristic impedance.

According to the signal transmission structure, the conductive layer comprises a plurality of first alignment perforated pads. And the coaxial cable connector can further comprise a plurality of alignment pins, which are suitable for inserting through first alignment perforated pads.

The aforementioned signal transmission structure comprises an insulation layer, and is disposed between the conductive layer and the first reference plane.

The present invention also provides another circuit board which comprises a signal through hole and a plurality of alignment through holes, and is appropriate for connecting to a coaxial cable connector. In addition, the coaxial cable connector has the signal pins expedient for inserting through signal through holes, and a plurality of alignment pins suitable for inserting through alignment through holes. The circuit board comprises a first reference plane, a conductive layer, and an insulation layer. The insulation layer is disposed between the first reference plane and the conductive layer. Furthermore, the conductive layer comprises a signal perforated pad, a first line segment, a second line segment, and a compensation pad. The signal pin is expediently inserted through the signal perforated pad. The first line segment and the signal perforated pad are connected. And the compensation pad is connected between the first line segment and the second line segment. The signal through hole penetrates through the first reference plane, the signal perforated pad of the conductive layer, and the insulation layer. However, the alignment through holes respectively penetrate the first reference plane, the conductive layer, and the insulation layer. Furthermore, the signal perforated pad has a first characteristic impedance. The second line segment has a second characteristic impedance; meanwhile, the compensation pad has a third characteristic impedance. The second characteristic impedance is larger than the third characteristic impedance.

The present invention further provides a connector assembly structure which comprises a circuit board and a coaxial cable connector. The coaxial cable connector is assembled on the circuit board, and the circuit board comprises a signal through hole and a plurality of alignment through holes. The circuit board comprises a first reference plane, a conductive layer, and an insulation layer. The insulation layer is disposed between the first reference plane and the conductive layer. The signal through hole and the alignment through holes penetrate the first reference plane, the conductive layer, and the insulation layer. Furthermore, the conductive layer comprises a signal perforated pad, a first line segment, a second line segment and a compensation pad. The first line segment is connected to the signal perforated pad. Whereas, the compensation pad is connected between the first line segment and the second line segment. The coaxial cable connector comprises a signal pin and a plurality of alignment pins. The signal pins are inserted into the signal perforated pad and the signal through holes; meanwhile, these alignment pins are inserted into the alignment through holes. Furthermore, the signal perforated pad has a first characteristic impedance. A second line segment has a second characteristic impedance. And the compensation pad has a third characteristic impedance, in which the second characteristic impedance is larger than the third characteristic impedance.

In the above aforementioned signal transmission structure, circuit board, and connector assembly structure, the conductive layer also comprises, for example, a second reference plane, which is surrounding the signal perforated pad, the first line segment, the compensation pad, and the second line segment. And the various portions of the second reference plane form a plurality of first alignment perforated pads. In addition, the second reference plane is, for example, the ground plane or the power plane.

The above described signal transmission structure, circuit board, and connector assembly structure comprise a first reference plane containing, for example, an open space region, in which the projection of the signal perforated pad and the first line segment at the first reference plane is inside the open space region.

In the aforementioned signal transmission structure, circuit board, and connector assembly, a width of the compensation pad is larger than a width of the second line segment. As a result, the second characteristic impedance is larger than the third characteristic impedance.

In the aforementioned signal transmission structure, circuit board, and connector assembly structure, the first line segment is, for example, the form of straight line or non-straight line shape.

In the aforementioned signal transmission structure, circuit board and connector assembly structure, the first line segment is, for example, surrounding parts of the signal perforated pad.

In the aforementioned signal transmission structure, circuit board, and connector assembly structure, the first line segment has a U-shaped bend.

In the aforementioned signal transmission structure, circuit board, and connector assembly structure, the first reference plane has, for example, a plurality of second alignment perforated pads corresponding to the first alignment perforated pads. And the alignment pin is expediently inserted through the second alignment perforated pad. Furthermore, the first alignment plane is, for example, a power plane or a ground plane.

Based on the above examples, the present invention uses the compensation pad for connecting between the first line segment and the second line segment, and the parasitic capacitance caused by the compensation pad and the first reference plane can be used for improving impedance continuity from the signal perforated pad to the second line segment. Therefore, the signal transmission structure, circuit board, and connector assembly structure according to the present invention can improve signal transmission quality.

Furthermore, the present invention can use the open space region and the compensation region for reducing the capacitance between the signal perforated pad with the first line segment and the first reference plane, and further improving the impedance continuity from the signal perforated pad to the second line segment. In addition, the present invention can use the first line segment in a non-straight line design for increasing the inductance between the first line segment and the first reference plane, and for increasing the impedance continuity between the signal perforated pad and the second line segment.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

First Embodiment

Figure 1A:
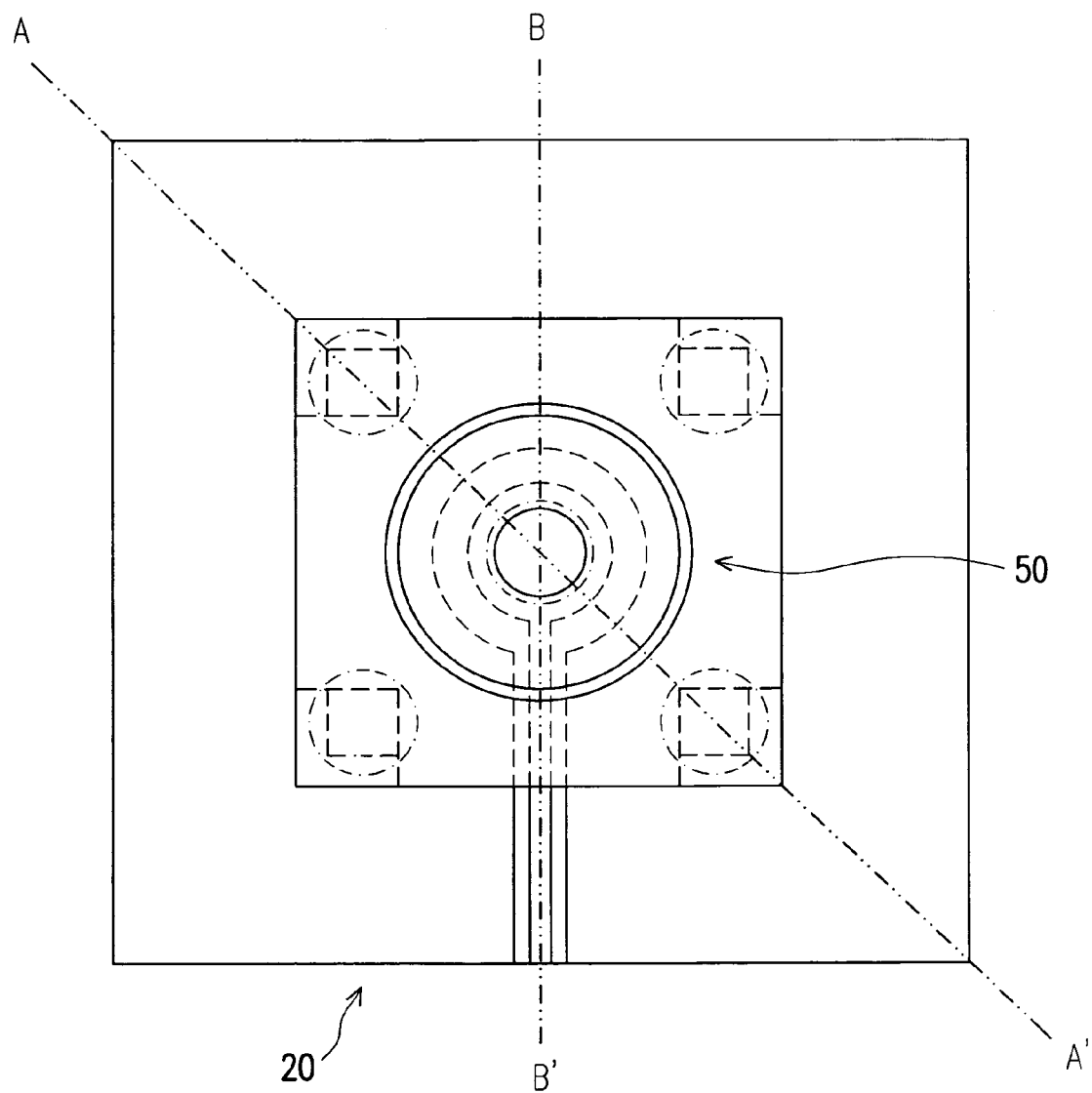
FIG. 1A is a top view of a conventional upright SMA connector assembled to a circuit board.
Figure 1B:
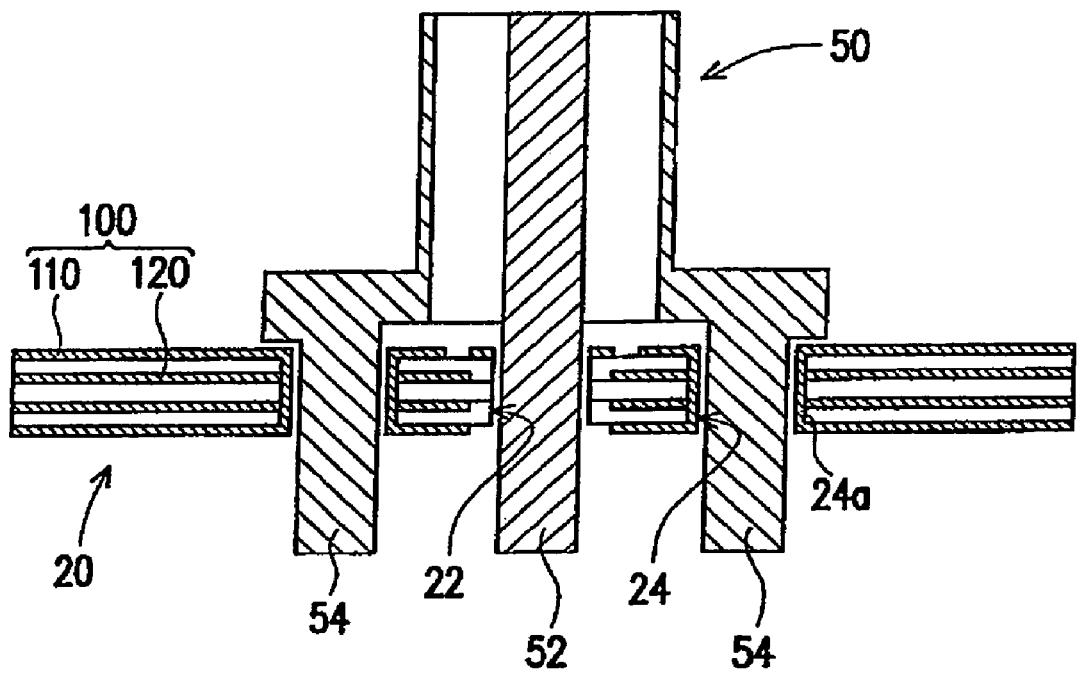
FIG. 1B and FIG. 1C are cross-sectional views through line A-A' and line B-B' of FIG. 1A respectively.
Figure 1C:
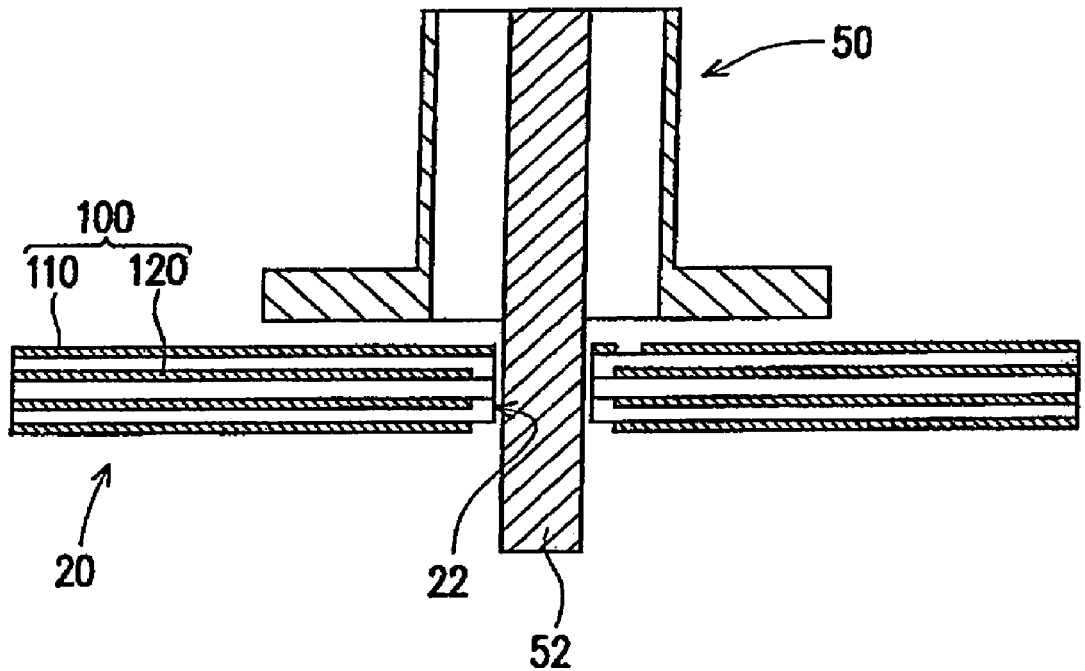
Figure 1D:
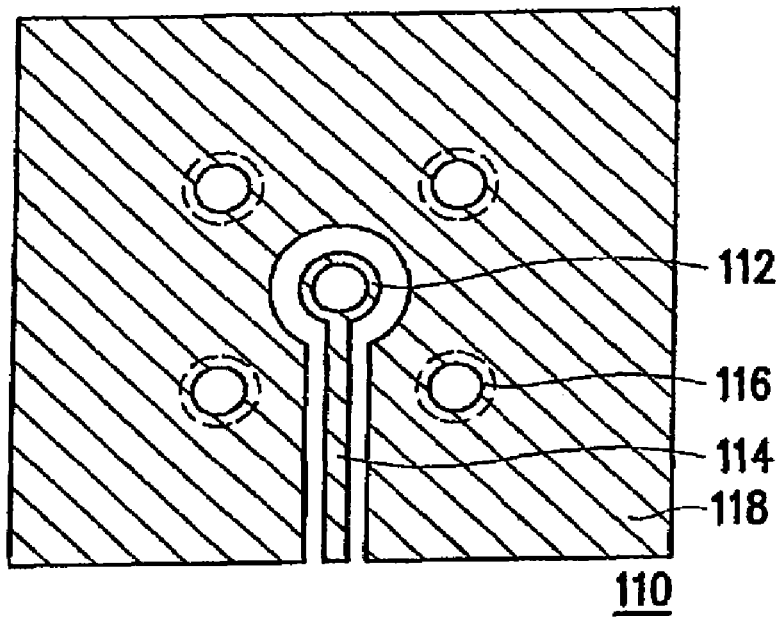
FIGS. 1D and 1E are top views according to a conductive layer and a reference plane of FIG. 1B.
Figure 1E:
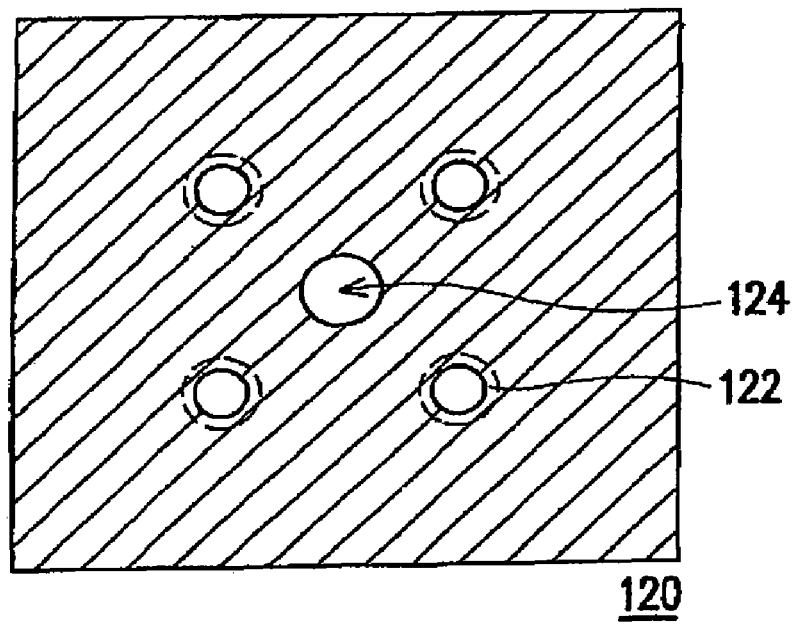
Figure 2A:
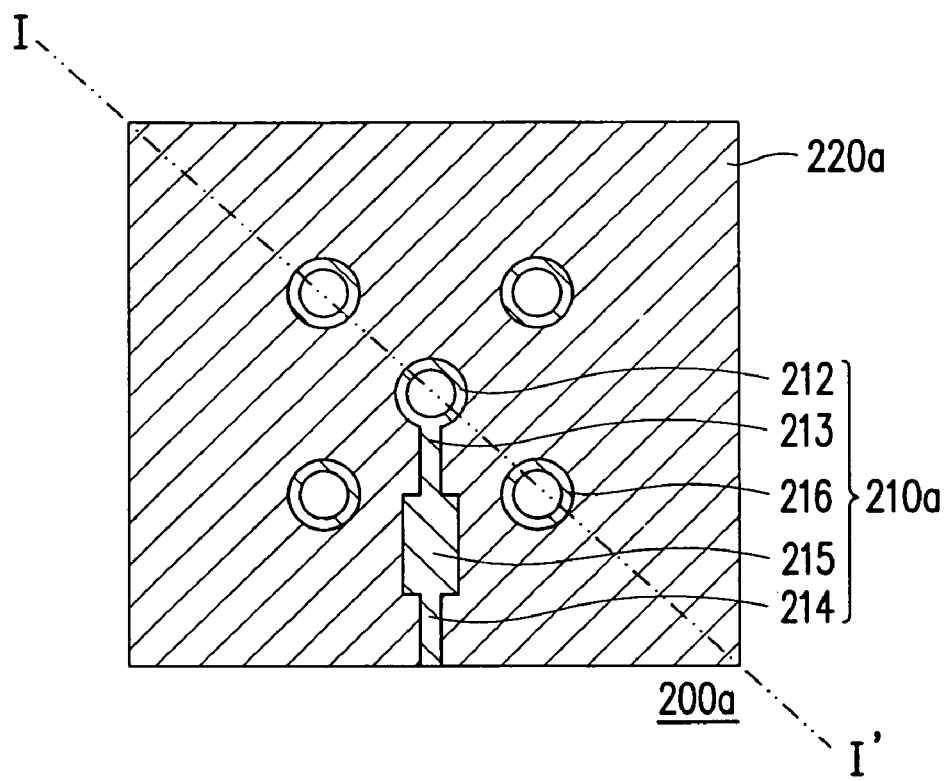
FIG. 2A is a top view of a signal transmission structure, according to an embodiment according to the present invention.
Figure 2B:
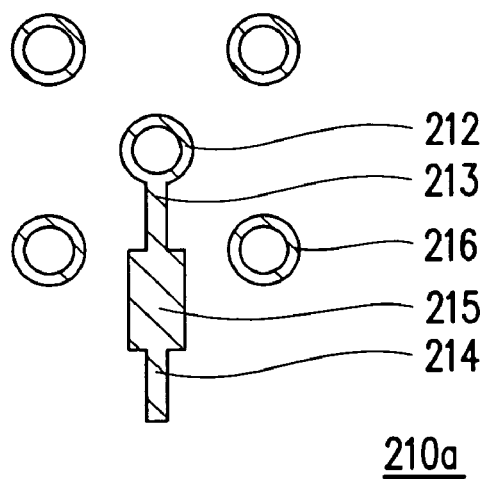
FIGS. 2B and 2C are top views of a conductive layer and a first reference plane in FIG. 2A, according to an embodiment according to the present invention respectively.
Figure 2C:
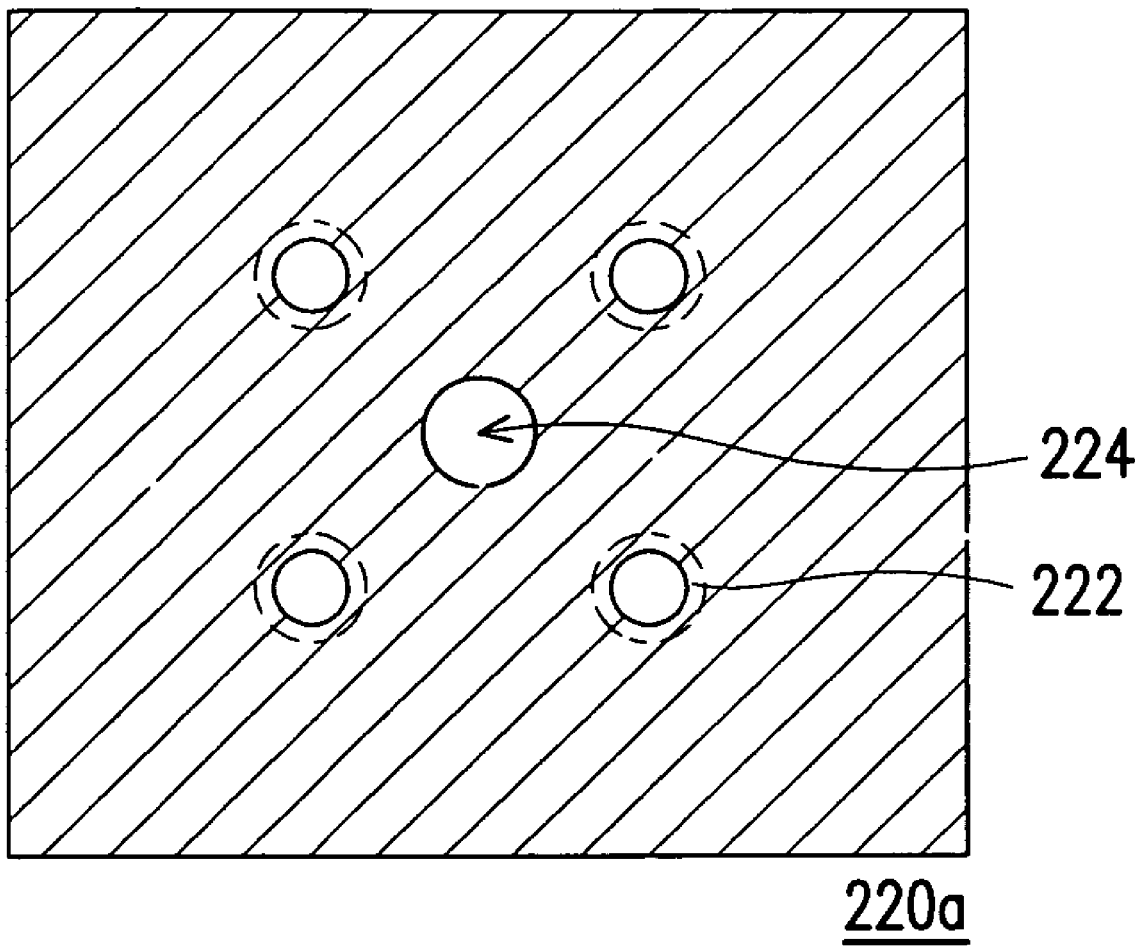
Figure 3:
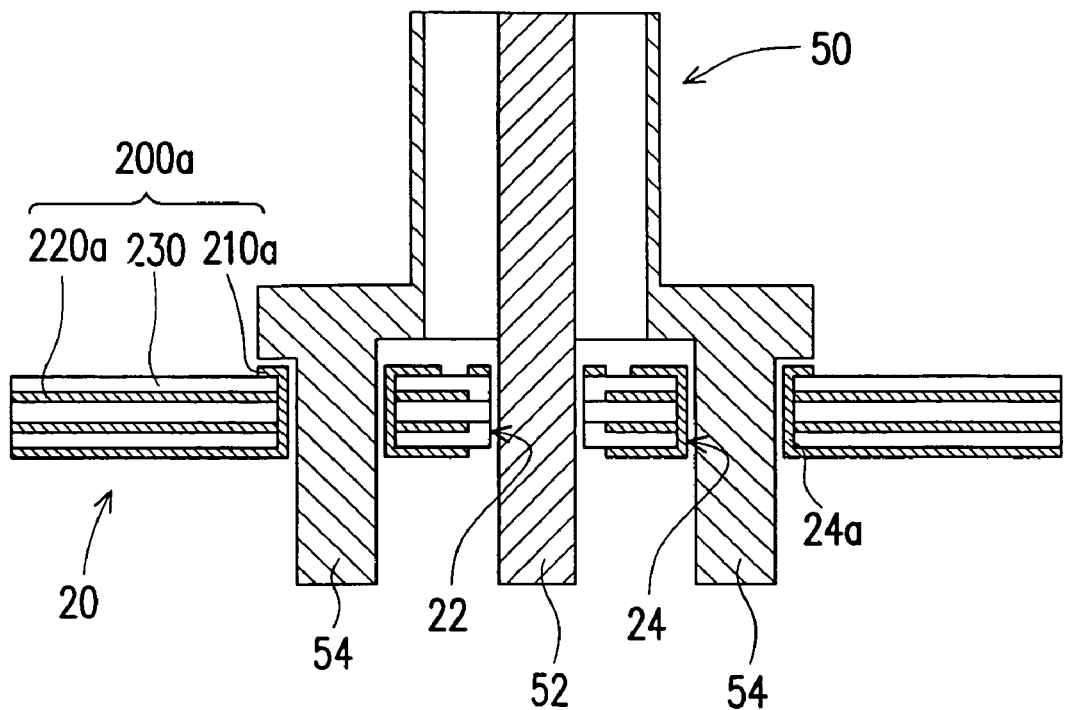
FIG. 3 is a cross-sectional view of the signal transmission structure in FIG. 2A.

FIG. 2A is a top view of a signal transmission structure according to an embodiment of the present invention, FIG. 2B and FIG. 2C are top views for individually illustrating the conductive layer and the first reference plane of the first embodiment. Whereas, FIG. 3 illustrates a cross-sectional view of signal transmission structure in FIG. 2A connecting with a connector. In reference to FIG. 2A to FIG. 2C and FIG. 3, FIG. 3 illustrates the signal transmission structure with the cross-sectional views through line I-I' in FIG. 2A. A signal transmission structure 200a of the embodiment of the present invention is suitable for connecting to a coaxial cable connector, in which the coaxial cable connector is an upright SMA connector 50 that includes a signal pin 52 and a plurality of alignment pins 54. The signal transmission structure 200a that is disposed at a circuit board 20 includes a conductive layer 210a and a first reference plane 220a. Whereas the conductive layer 210a and the first reference plane 220a are respectively belonging to a part of the circuit board 20. And the conductive layer 210a is disposed at a side of the first reference plane 220a. Furthermore, the conductive layer 210a includes a signal perforated pad 212, a first line segment 213, a second line segment 214, and a compensation pad 215. The signal pin 52 of the upright SMA connector 50 is inserted into the corresponding signal through hole 22 of the circuit board 20, and is expediently inserting into the signal perforated pad 212, and coming into contact with the signal perforated pad 212, thus allowing the signal transmission at the signal perforated pad 212. In addition, the first line segment 213 and the signal perforated pad 212 are connected together, and the compensation pad 215 is connected between the first line segment 213 and second line segment 214.

In the aforementioned signal transmission structure 200a, the conductive layer 210a includes a plurality of first alignment perforated pads 216. However, the first reference plane 220a includes, for example, the alignment perforated pads 222 which are respectively corresponding to the first alignment perforated pads 216. Each alignment pin 54 of the SMA connector 50 is inserted into the corresponding alignment through hole 24 of the circuit board 20, thus allowing the SMA connector 50 to be affixed on the circuit board 20. Furthermore, the alignment pin 54 further inserts through the corresponding first alignment perforated pads 216 and 222 to electrically connect to the first reference plane 220a. Furthermore, in the embodiment, a conductive wall 24a can be formed at the alignment through hole 24 for improving combined mechanical strength between the alignment pin 54 and the circuit board 20's. Furthermore, the embodiment's first reference plane 220a can be a power plane or a ground plane, with an insulating opening 224 for preventing short circuit caused by contacting with the signal pin 52.

Because the conductive layer 210a of the present embodiment includes a compensation pad 215, the width of the compensation pad 215 shown in FIG. 2A is, for example, larger than the width of the second line segment 214 (the second line segment 214 width in FIG. 2A). Therefore the equivalent capacitance between the compensation pad 215 and the first reference plane 220a is higher, making the characteristic impedance of the compensation pad 215 less than the characteristic impedance of the second line segment 214 and larger than the characteristic impedance of the signal perforated pad 212. Further in accordance with the phase adjustment caused by the first line segment 213, this can thus increase the characteristic impedance continuity for the signal transmission structure 200a and improve the signal transmission quality especially during high frequency transmission.

In the first embodiment, an insulation layer 230 is, for example, disposed between the conductive layer 210a and the first reference plane 220a for preventing the conductive layer 210a and the first reference plane 220a from electrical connection. Remarkably, the signal transmission structure 200a of the first embodiment not only includes the above conductive layer 210a, the first reference plane 220a, and the insulation layer 230, but also includes other conductive layers, reference planes, and insulation layers.

Second Embodiment

Figure 4A:
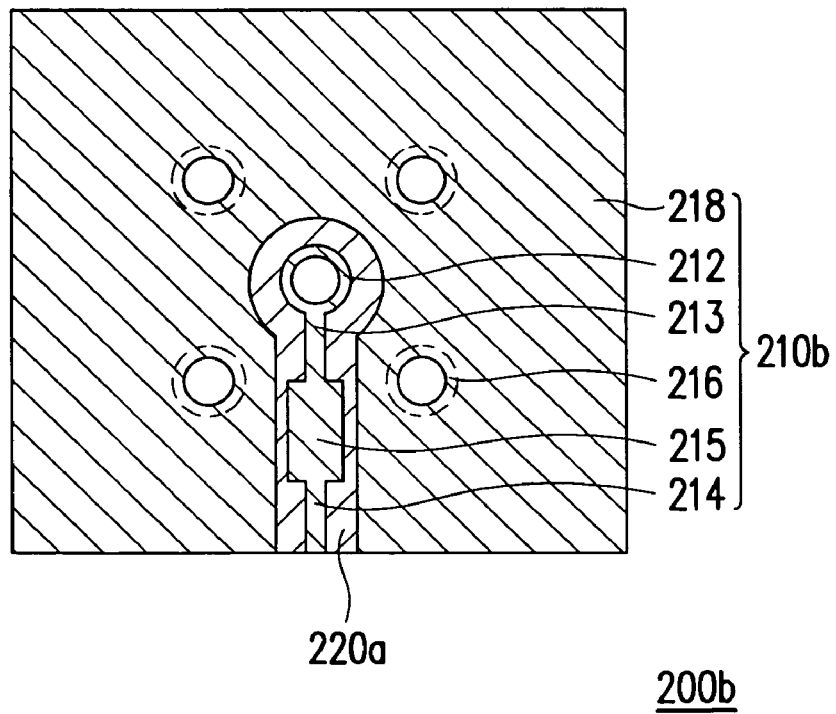
FIG. 4A is a top view of a signal transmission structure of the second embodiment according to the present invention.
Figure 4B:
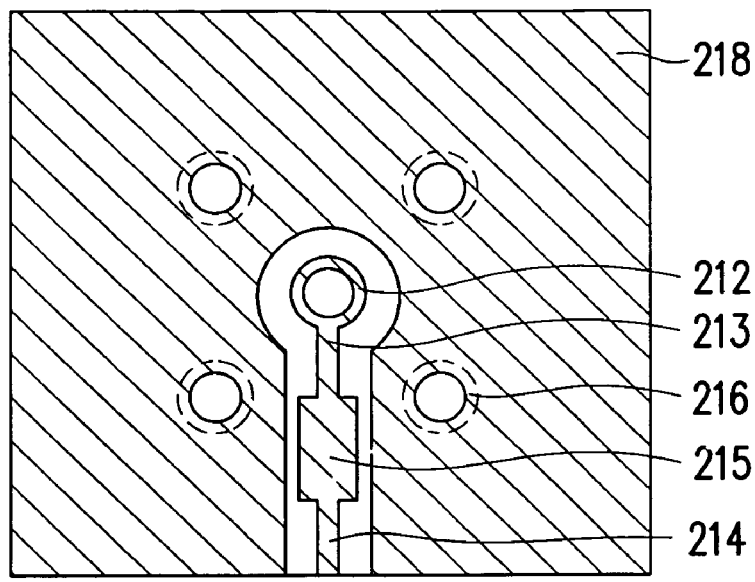
FIGS. 4B and 4C are top views, schematically illustrating a conductive layer and the first reference plane in FIG. 4A, according to an embodiment according to the present invention.
Figure 4C:
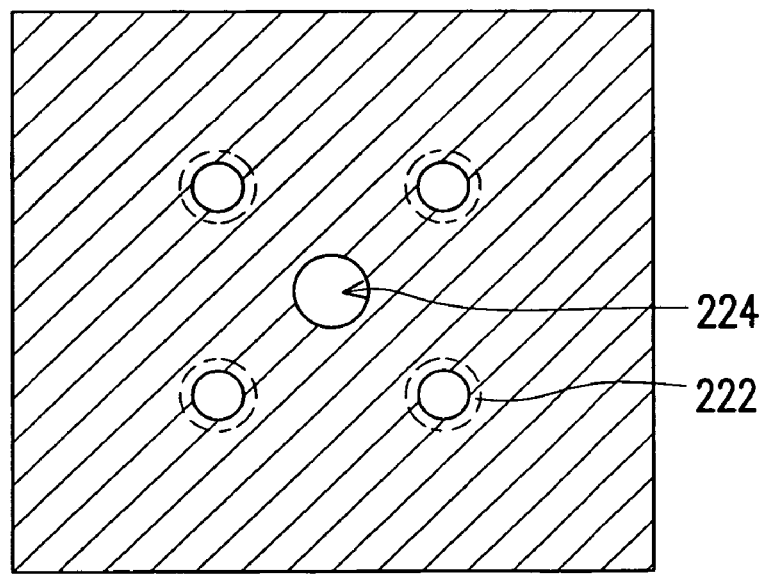

FIG. 4A schematically illustrates a top view of a signal transmission structure, according to a second embodiment of the present invention. FIG. 4B and FIG. 4C respectively illustrates a top view of FIG. 4A at the conductive layer and the first reference plane. Referring to FIG. 4A to FIG. 4C, the present embodiment signal transmission structure 200b of the embodiment is similar to the signal transmission structure 200a (as shown in FIG. 2A). However, the differences are found at the conductive layer 210b of the signal transmission structure 200b having a second reference plane 218, and surrounding the signal perforated pad 212, the first line segment 213, the compensation pad 215, and the second line segment 214. The above described first alignment perforated pad 216 is, for example, constructed from a plurality of sections from the second reference plane 218. Furthermore, the second reference plane 218 can be a ground plane or a power plane.

Third Embodiment

Figure 5A:
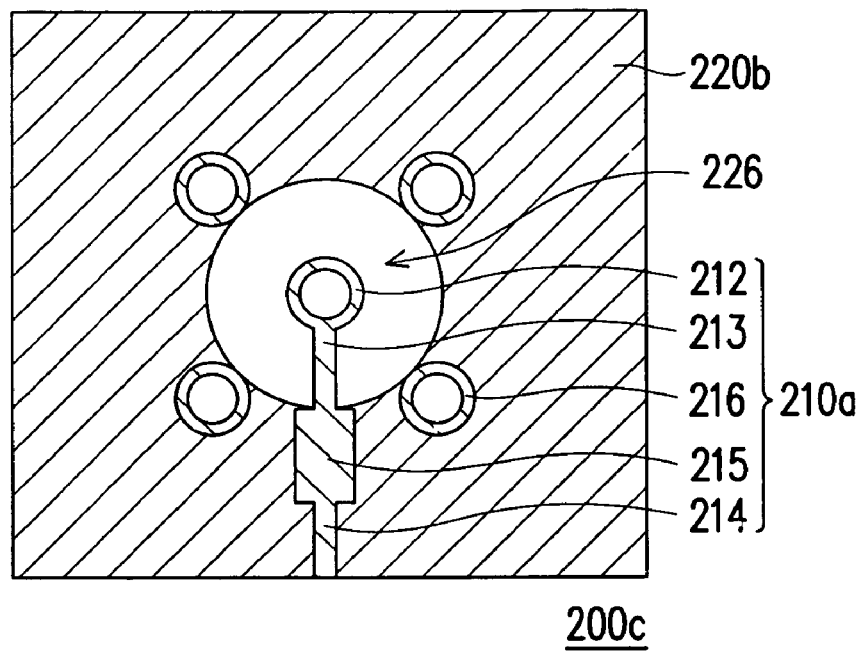
FIGS. 5A and 5B are top views, schematically illustrating two separate signal transmission structures, according to the third embodiment of the present invention.
Figure 5B:
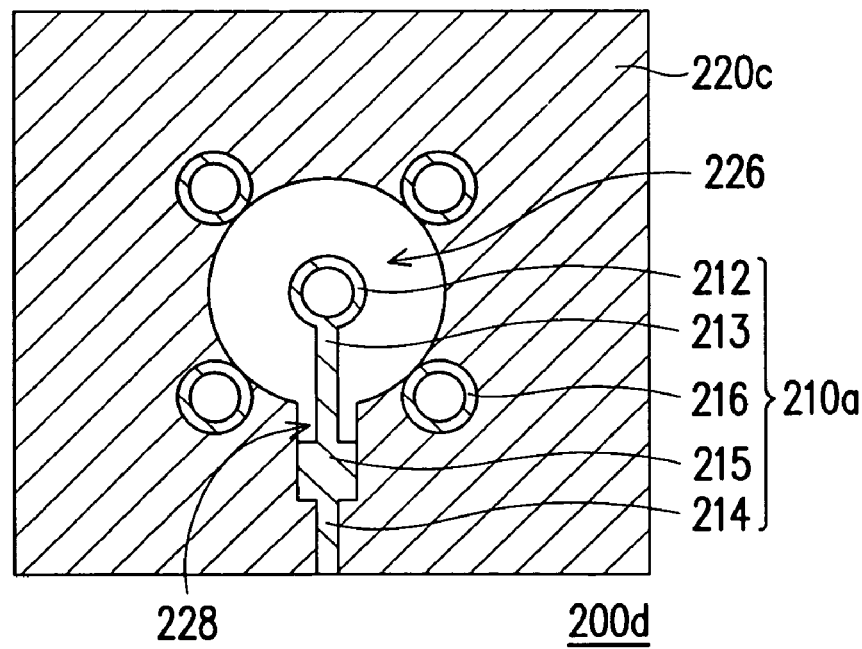

FIG. 5A and FIG. 5B respectively illustrates a top view of the two signal transmission structures according to the third embodiment of the present invention. In reference to FIG. 5A, because it is similar to the first embodiment shown in FIG. 2A, only the differences are described. The first reference plane 220b of the signal transmission structure 200c in the embodiment includes an open space region 226. The open space region 226 is the non-conducting region of the first reference plane 220b. The projection of the signal perforated pad 212 and the first line segment 213 at the first reference plane 220b is located within the open space region 226.

In other words, the present embodiment can enlarge the insulating opening 224 of the first reference plane 220b (as shown in FIG. 2C) to form the open space region 226. As a result, it can reduce the capacitance between the signal perforated pad 212 with the first line segment 213 and the first reference plane 220c, and further raise the characteristic impedance of the signal perforated pad 212 and the first line segment 213. The characteristic impedance of the first line segment 213 is larger than the characteristic impedance of the signal perforated pad 212 and the characteristic impedance of the compensation pad 215. Therefore, the transmission structure 200c of the present embodiment can further reduce the difference of the characteristic impedance between the signal perforated pad 212 with the first line segment 213 and the compensation pad 215, and increase the characteristic impedance continuity of the signal transmission path, leading to improved transmission quality.

Referring to FIG. 5B, the difference between FIG. 5B and FIG. 5A is found at the first reference plane. In other words, the first reference plane 220c of the signal structure 200d in the embodiment includes a compensation region 228. The compensation region 228 with the open space region 212 together are a non-conducting region of first reference plane 220c. And a portion of the first line segment 213 with the signal pad at the projected view on the first reference plane 220c is located within the open space region 226. The other portion of the first line segment 213 in the projected view at the first reference plane 220c is located within the compensation region 228.

The design for the compensation region 228 is for increasing the inductance between the first line segment 213 inside the compensation region 228 and the first reference plane 220c, thus increasing the characteristic impedance and adjusting the phase delay. As a result, the characteristic impedance continuity for signal transmission path can be improved and a superior signal transmission quality can be achieved.

According to the above described embodiments, the first line segment for the conductive layer has a straight line shape. However, in the present invention, one can also make a non-straight line design for the first line segment for increasing the inductance between the first line segment and the first reference plane, allowing for increasing the characteristic impedance for the first line segment. At the same time, the phase delay for the first line segment can be properly adjusted. Two embodiments with non-straight line shape for the first line segments are further presented, they does not limit the scope of the present invention.

Fourth Embodiment

Figure 6A:
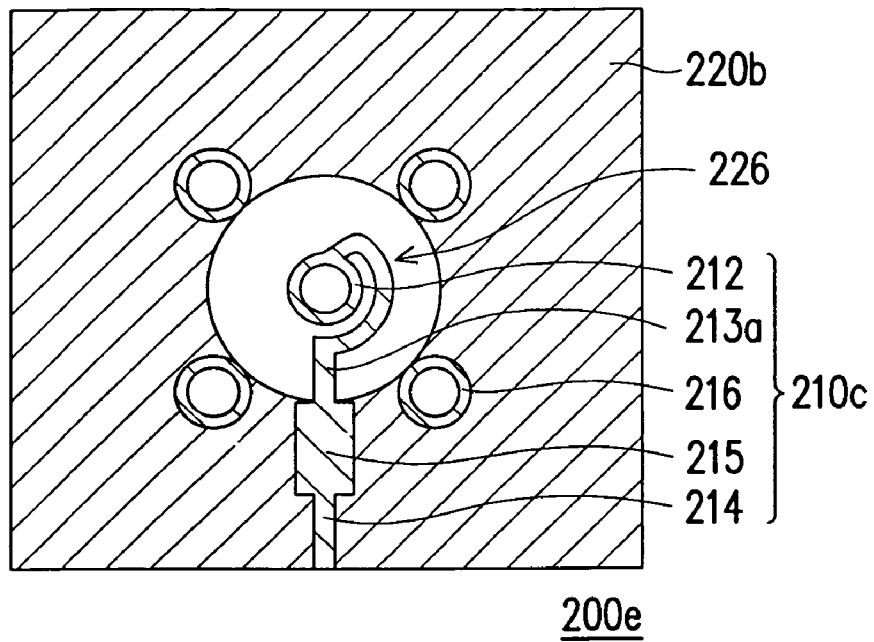
FIGS. 6A and 6B are top views, schematically illustrating two separate signal transmission structures, according to the fourth embodiment of the present invention.
Figure 6B:
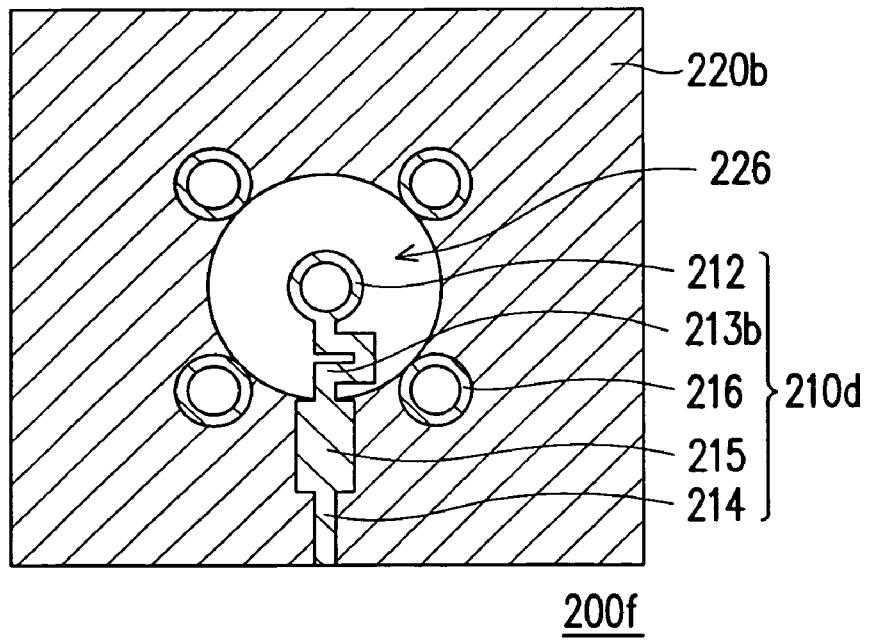

FIG. 6A and FIG. 6B are top views, schematically illustrating the two types of signal transmission structures, according to the fourth embodiment of the present invention. Referring to FIG. 6A and FIG. 6B, the first line segment 213a of the conductive layer 210c in the signal transmission structure 200e is, for example, surrounding a part of the signal perforated pad 212. Whereas, the first line segment 213b includes, for example, a U-shaped bend in the signal transmission structure 200f.

Because of the above described first line segment 213a, 213b has a non-straight line shape for increasing the inductance between it and the first reference plane 220b and for increasing the characteristic impedance of the first line segments 213a and 213b and for adjusting the phase delay, and leading to improved characteristic impedance continuity for signal transmission path, thus achieving improved signal transmission quality.

In summary, the signal transmission structure of the present invention includes at least the following advantages:
1. By using the compensation pad and the first reference plane, the parasitic capacitance is generated for improving the impedance continuity between the signal perforated pad and the second line segment, thus improving the quality of signal transmission.
2. Using the open space region for lowering the capacitance between the signal perforated pad with the first line segment and the first reference plane, and for increasing the characteristic impedance for the signal perforated pad and the first line segment. This offers improvement for the impedance continuity between the signal perforated pad and the second line segment, and thus further improving the signal transmission quality.
3. Using the compensation region adjacent to the open space region for increasing the inductance between the first line segment located within the compensation region and the first reference plane, and for increasing the impedance continuity between the signal perforated pad and the second line segment, thus improving signal transmission quality
4. In an embodiment, because of the non-straight line design for the first line segment, the inductance between the first line segment and the first reference plane can be increased, and the phase delay can be appropriately adjusted, thus improving the impedance continuity between the signal perforated pad and the second line segment and improving the signal transmission quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal transmission structure, suitable for connecting with a coaxial cable connector, the coaxial cable connector comprising a signal pin, the signal transmission structure comprising: a first reference plane; and a conductive layer, disposing at a side of a first reference plane, the conductive layer including: a signal perforated pad, for inserting the signal pin of the coaxial cable connector, having a first characteristic impedance; a first line segment, connecting with the signal perforated pad; a second line segment, having a second characteristic impedance; and a compensation pad, connecting between the first line segment and the second line segment, and having a third characteristic impedance, wherein the second characteristic impedance is larger than the third characteristic impedance, and wherein the first reference plane comprises an open space region, and a projected view for the compensation pad is entirely outside the open space region.

2. The signal transmission structure as claimed in claim 1, wherein the third characteristic impedance is larger than the first characteristic impedance.

3. The signal transmission structure as claimed in claim 1, wherein the first line segment has a fourth characteristic impedance larger than the first characteristic impedance and the third characteristic impedance.

4. The signal transmission structure as claimed in claim 1, wherein the conductive layer further comprises a plurality of alignment perforated pads, and the coaxial cable connector comprises a plurality of alignment pins, for inserting into the first alignment perforated pads.

5. The signal transmission structure as claimed in claim 1, wherein the conductive layer further comprises a second reference plane surrounding the signal perforated pads, the first line segment, the compensation pad, and the second line segment, and a plurality of parts of the second reference plane form a plurality of first alignment perforated pads.

6. The signal transmission structure as claimed in claim 1, wherein a projected view for the signal perforated pad and the first line segment at the first reference plane is inside the open space region.

7. The signal transmission structure as claimed in claim 1, wherein a width of the compensation pad is larger than a width of the second line segment, so as to allow the second characteristic impedance to be larger than the third characteristic impedance.

8. The signal transmission structure as claimed in claim 1, wherein the first line segment is a straight line shape.

9. The signal transmission structure as claimed in claim 1, wherein the first line segment is a non-straight line shape.

10. The signal transmission structure as claimed in claim 9, wherein the first line segment is surrounding a part of the signal perforated pad.

11. The signal transmission structure as claimed in claim 9, wherein the first line segment comprises a U-shaped bend.

12. A circuit board, having a signal through hole and a plurality of alignment through holes, and suitable for connecting with a coaxial cable connector, and the coaxial cable connector having a signal pin for inserting into the signal through hole and a plurality of alignment pins for inserting into the alignment through holes, the circuit board comprising: a first reference plane; a conductive layer, disposing at a side of the first reference plane, wherein the conductive layer comprises: a signal perforated pad, having a first characteristic impedance; a first line segment, connecting with the signal perforated pad; a second line segment, having a second characteristic impedance, and a compensation pad, connected between the first line segment and the second line segment, and having a third characteristic impedance, wherein the second characteristic impedance is larger than the third characteristic impedance; and an insulation layer, disposed between the first reference and the conductive layer, wherein the signal through hole penetrates through the first reference plane, the signal perforated pad of the conductive layer, and the insulation layer, and the alignment through holes are respectively penetrating through the first reference plane, the conductive layer, and the insulation layer, and wherein the first reference plane comprises an open space region, and a projected view for the compensation pad is entirely outside the open space region.

13. The circuit board as claimed in claim 12, wherein the conductive layer further comprises a second reference plane, surrounding the signal perforated pad, the first line segment, the compensation pad, and the second line segment, and a plurality of parts of the second reference plane form a plurality of first alignment perforated pads.

14. The circuit board as claimed in claim 12, wherein a protection of the signal perforated pad and the first line segment at the first reference plane is located within the open space region.

15. The circuit board as claimed in claim 12, wherein the first line segment is a straight line shape.

16. The circuit board as claimed in claim 12, wherein the first line segment is a non-straight line shape.

17. A connector assembly structure, comprising: a circuit board, having a signal through hole and a plurality of alignment through holes, the circuit board comprising: a first reference plane; a conductive layer, disposing at a side of the first reference plane, the conductive layer comprising: a signal perforated pad, having a first characteristic impedance; a first line segment, connecting with the signal perforated pad; a second line segment, having a second characteristic impedance, and a compensation pad, connected between the first line segment and the second line segment, and having a third characteristic impedance, wherein the second characteristic impedance is larger than the third characteristic impedance; and an insulation layer, disposing between the first reference plane and the conductive layer, wherein the signal through hole and the alignment through holes are penetrating the first reference plane, the conductive layer, and the insulation layer; and a coaxial cable connector, having a signal pin and a plurality of alignment pins, wherein the signal pin is inserting into the signal perforated pad and into the signal through hole, and the alignment pins are inserting into the alignment through holes, and wherein the first reference plane comprises an open space region, and a projected view for the compensation pad is entirely outside the open space region.

18. The connector assembly structure as claimed in claim 17, wherein the conductive layer further comprises a second reference plane, surrounding the signal perforated pad, the first line segment, the compensation pad, and the second line segment, and a plurality of parts of the second reference plane form a plurality of first alignment perforated pads.

19. The connector assembly structure as claimed in claim 17, wherein a projection of the signal perforated pad and the first line segment at the first reference plane is located within the open space region.

20. The connector assembly as claimed in claim 17, wherein a width of the compensation pad width is larger than a width of the second line segment, so as to allow the second characteristic impedance to be larger than the third characteristic impedance.

* * * * *